United States Patent
Pollock

(10) Patent No.: US 6,319,739 B1
(45) Date of Patent: Nov. 20, 2001

(54) MOLD COMPOUND SELECTION FOR TSOP POST MOLD CURE PROCESSING

(75) Inventor: Jeffrey James Pollock, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/543,891

(22) Filed: Apr. 6, 2000

(51) Int. Cl.⁷ .................................................... H01L 21/00
(52) U.S. Cl. ............................ 438/25; 438/126; 438/127; 257/723; 257/687; 257/708
(58) Field of Search ................................. 438/25, 26, 126, 438/127; 257/723, 708, 687, 678

(56) References Cited

U.S. PATENT DOCUMENTS

| | | |
|---|---|---|
| 5,357,139 | 10/1994 | Yaguchi et al. . |
| 5,414,928 * | 5/1995 | Bonitz et al. . |
| 5,446,313 | 8/1995 | Masuda et al. . |
| 5,567,749 * | 10/1996 | Sawamura et al. . |
| 5,669,137 | 9/1997 | Ellerson et al. . |
| 5,708,056 | 1/1998 | Lindley et al. . |
| 5,895,969 | 4/1999 | Masuda et al. . |
| 5,960,539 | 10/1999 | Burns . |

* cited by examiner

Primary Examiner—Caridad Everhart

(57) ABSTRACT

Warpage-free post-mold curing (PMC) of encapsulated device arrays, e.g., TSOPs, is performed without requiring placement of heavy metal weights on the arrays by utilization of molding/encapsulant materials having reduced coefficients of thermal expansion (CTE) and increased flexural moduli at both high and low temperature. Good lead co-planarity is maintained subsequent to PMC as a result of better matching of the encapsulant/molding material properties with those of the IC chip, lead frame, and substrate (e.g., Cu or Cu-based).

17 Claims, No Drawings

MOLD COMPOUND SELECTION FOR TSOP POST MOLD CURE PROCESSING

FIELD OF THE INVENTION

The present invention generally relates to electrical device packages and an improved method for manufacturing same. More particularly, the present invention relates to an improved method of making semiconductor integrated circuit (IC) devices having thin, small outline packages (TSOPs) without incurring disadvantageous substrate warping and loss of lead co-planarity.

BACKGROUND OF THE INVENTION

Semiconductor devices, such as integrated circuit (IC) devices, are typically fabricated in the form of small, thin, and thus fragile, dies or chips which are electrically connected to a lead frame or other mounting by means of a plurality of leads extending therefrom and attached to very fine and fragile wires, and then protected from physical damage, environmentally-induced degradation, etc., by means of an encapsulant material which surrounds the die or chip and associated lead frame or other type mounting. According to conventional large-scale manufacturing technology, a plurality of individual dies or chips are physically secured, and electrically connected, to a common substrate, e.g., a copper (Cu) or Cu alloy-based substrate in the form of an elongated strip, and then encapsulated, as by molding, within a layer of encapsulant material, typically an epoxy resin-based material. The common substrate can be in the form of a narrow strip having a single row of spaced-apart encapsulated dies or chips mounted on the surface thereof or in a wider form for mounting thereon a two-dimensional array of encapsulated dies or chips arranged in rows and columns. In either instance, a plurality of discrete device packages are obtained from the encapsulated array by segmenting the substrate in the spaces between adjacent dies or chips.

In recent years, electronic device packages of relatively low height profile have been developed, which in turn include a relatively thin, thus easily deformable substrate, e.g., of Cu or Cu-based alloy. Such packages are referred to in the art as "TSOP"s. the acronym for thin, small outline packages. Such devices, or packages, having a low vertical profile, occupy a minimum of height on the substrate, and further are capable of being surface mounted to respective circuitry on the substrate surface, e.g., conductor pads, by means of conventional, e.g., soldering, techniques. Thus, TSOP packages are able to provide a desired electrical or electronic function while assuring a compact, low profile which affords a substantial savings in space for the final product utilizing same.

According to conventional methodology for large-scale manufacture of such TSOPs, a plurality of semiconductor IC dies or chips, along with their respective lead frames, are mounted in spaced-apart fashion to form an array on the surface of a thin substrate and electrically connected to respective circuitry thereon, the substrate typically comprised of a Cu or Cu alloy-based thin sheet or foil about 0.120 to about 0.135 mm thick. The resultant array is placed in a suitably configured, heated mold for encapsulating each die or chip in a layer of molding or encapsulant material, e.g., an epoxy resin-based material. Molding for encapsulation utilizing conventionally employed epoxy resin-based materials is typically performed at a temperature of about 175+/−5° C. for about 60 to about sec. Subsequent to molding, a plurality of the encapsulated, strip-shaped arrays are vertically stacked and loaded into magazines for insertion into ovens for performing post-mold curing, typically at about 175° C. for about 5 hrs. for conventional epoxy resin-based molding materials. After completion of post-mold curing, the magazines are removed from the ovens and the post-mold cured, encapsulated arrays permitted to cool down in the ambient air to room temperature (typically within about 30–45 min.).

However, when performing the above-described conventional molding for device encapsulation, it has been found necessary to place heavy metal (e.g., lead, Pb) bars on top of the stack of encapsulated arrays loaded into each magazine prior to performing the post-mold curing process, in order to avoid undesirable chip and/or substrate warpage which otherwise results from the post-mold curing process, which warpage has been correlated with unacceptable loss of electrical lead co-planarity. Disadvantageously, however, the placement of the heavy metal bars to the tops of the encapsulated arrays loaded into the magazines prior to performing the post-mold curing is conducted manually, and therefore is a time-consuming process which runs counter to the requirements of economically viable, automated, mass-production techniques and methodologies.

Accordingly, there exists a need for improved methodology for reliable, high quality manufacture of arrays of encapsulated semiconductor IC devices and discrete device packages therefrom, such as TSOPs, which methodology avoids the above-described drawbacks and disadvantages attendant upon fabrication according to conventional encapsulation processing, including, inter alia, loss of electrical lead co-planarity and time consuming placement and removal of heavy metal bars used for prevention of strip warpage upon post-mold curing. Moreover, there exists a need for improved encapsulation methodology for making devices such as TSOPs which is fully compatible with all aspects, including cost and throughput requirements, of mass manufacturing techniques.

The present invention, wherein the molding material selected for encapsulation of the IC dies or chips forming part of the TSOP devices exhibits, inter alia, a reduced coefficient of thermal expansion which provides good compatibility with the thermal expansion characteristics of the other components of the package, e.g., the IC chip, lead frame, and substrate, and an increased flexural modulus at both high and low temperatures which places less deformation-inducing forces on the other components of the package, effectively addresses and solves the above-described problems and drawbacks of the conventional methodology. According to the present invention, the drawbacks and disadvantages associated with the use of conventional encapsulant materials which produce molding material-induced stresses tending to cause warpage of the thin, e.g., Cu or Cu alloy-based substrates utilized in forming the TSOPs, are substantially eliminated, or at least minimized, thereby effectively preventing loss of lead co-planarity without requiring time-consuming, manual placement of heavy metal bars on top of the array stack loaded into magazines prior to performing post-mold curing. Further, the methodology provided by the instant invention enjoys diverse utility in the manufacture of all manner of encapsulated device arrays and discrete device packages obtained therefrom.

DISCLOSURE OF THE INVENTION

An advantage of the present invention is an improved method of making at least one packaged electrical device or component.

Another advantage of the present invention is an improved method of making an encapsulated array of semiconductor devices useful in forming therefrom at least one discrete semiconductor device package.

Still another advantage of the present invention is an improved method for making semiconductor integrated circuit (IC) devices in the form of TSOPs having improved lead co-planarity.

Yet another advantage of the present invention is an improved TSOP semiconductor IC device.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained, in part, by a method of making at least one packaged electrical device or component, comprising the steps of:

(a) providing an elongated, strip-shaped substrate having a major surface thereof adapted for mounting thereon an array comprising a plurality of spaced-apart electrical devices or components;

(b) providing and mounting the plurality of electrical devices or components in a spaced-apart array on the major surface of the substrate;

(c) encapsulating the array of electrical devices or components by molding utilizing a molding material selected to provide substantially no, or at least minimal, warping of the array or the substrate upon completion of a post-mold curing treatment performed without placement of a weight on the array; and (d) performing the post-mold curing of the encapsulated array at an elevated temperature and for a time sufficient to complete curing of the molding material with substantially no, or at least minimal, warping of the array or the substrate leading to loss of electrical lead co-planarity.

According to an embodiment of the present invention, the method further comprises the step of:

(e) segmenting the array of encapsulated electrical devices or components to form at least one packaged electrical device or component therefrom.

According to further embodiments of the present invention, step (a) comprises providing a substrate comprised of copper (Cu) or a Cu-based alloy; step (b) comprises providing a plurality of semiconductor devices, e.g., semiconductor integrated circuit (IC) devices in the form of dies or chips each having a plurality of co-planar electrical leads extending therefrom, and the at least one packaged device is a thin, small outline package (TSOP); step (c) comprises encapsulating utilizing a molding material having a filler content on the order of from about 80 to about 90 wt. %, reduced coefficients of thermal expansion (CTE) $\alpha_1$ and $\alpha_2$ on the order of about $1 \times 10^{-5}/°$ C. and about $4 \times 10^{-5}/°$ C., respectively, and increased low and high temperature flexural moduli on the order of about 2,500 kgf/mm$^2$ and about 100 kgf/mm$^2$, respectively.

According to embodiments of the present invention, step (c) comprises utilizing an epoxy resin-based molding material at a mold temperature of about 175° C.; and step (d) comprises performing the post-mold curing of the encapsulated array at a temperature of about 175° C. for about 5 hours, and further includes cooling the post-mold-cured encapsulated array in air to ambient room temperature.

According to another aspect of the present invention, a method of making at least one TSOP structure comprises the steps of:

(a) providing an elongated, strip-shaped substrate having a major surface for mounting thereon a spaced-apart array comprising a plurality of low profile semiconductor integrated circuit (IC) devices in the form of dies or chips, each IC die or chip including a plurality of co-planar electrical leads extending therefrom for connection to circuitry on the substrate major surface;

(b) mounting the plurality of IC dies or chips in spaced-apart array on the substrate major surface;

(c) encapsulating the array of IC dies or chips by molding utilizing a molding material selected to provide substantially no, or at least minimal, warping of the array of IC dies or the substrate upon completion of a post-mold curing treatment performed without the use of a heavy weight placed on top of the array, thereby maintaining substantial co-planarity of the electrical leads; and (d) performing the post-mold curing of the encapsulated array at an elevated temperature and for a time sufficient to complete curing of the molding material with substantially no, or at least minimal, warping of the array or the substrate.

According to embodiments of the present invention:

step (a) comprises providing a substrate comprised of copper (Cu) or a Cu-based alloy;

step (c) comprises encapsulating utilizing an epoxy resin-based molding material having a filler content on the order of from about 80 to about 90 wt. %, reduced coefficients of thermal expansion (CTE) $\alpha_1$ and $\alpha_2$ on the order of about $1 \times 10^{-5}/°$ C. and about $4 \times 10^{-5}/°$ C., respectively, and increased low and high temperature flexural moduli on the order of about 2,500 kgf/mm$^2$ and about 100 kgf/mm$^2$, respectively; and step (d) comprises performing post-mold curing of the encapsulated array at a temperature of about 175° C. for about 5 hours.

According to further embodiments of the present invention:

step (c) comprises encapsulating the array in the epoxy resin-based molding material at a mold temperature of about 175° C.; and step (d) further comprises performing the post-mold curing on a stacked plurality of encapsulated arrays loaded into a magazine and cooling the post-mold-cured encapsulated arrays in air to ambient room temperature.

According to still further embodiments of the present invention, the method further comprises the step of:

(e) segmenting the encapsulated array(s) to form at least one discrete TSOP structure.

According to another aspect of the present invention, at least one TSOP IC device fabricated according to the above steps (a)–(e) is provided.

Additional advantages and aspects of the present invention will become readily apparent to those skilled in the art from the following detailed description, wherein embodiments of the present invention are described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the description is to be regarded as illustrative in nature, and not as limitative.

DESCRIPTION OF THE INVENTION

The present invention is based upon recognition by the inventor that undesirable warpage of encapsulated device arrays comprising a plurality of electrical devices or components mounted on a common substrate, which warpage results from post-mold curing of the encapsulated array and is correlated with an increased loss of electrical lead co-planarity, is due, at least in significant part, by:

(1) a mismatch between the coefficients of thermal expansion (CTE) of the molding material utilized for encapsulation, typically an epoxy resin-based material, and the array components, i.e., the semiconductor IC die or chip (typically of silicon, Si), associated lead frame (typically metallic), and substrate (e.g., thin Cu or Cu-based alloy in the case of TSOPs), wherein the CTE of the molding material is too high relative to the array components; and (2) inadequate flexural or elastic properties of the cured molding material, leading to stresses sufficient to cause bending, i.e., warping, of the relatively thin, thus easily deformable substrate.

The present invention is further based upon recognition by the inventor that selection and use of a molding material having favorable characteristics with respect to the above-described parameters facilitates performing the post-mold curing of encapsulated electrical device arrays, including semiconductor IC chip-containing TSOPs, without incurring deleterious warpage leading to loss of electrical lead co-planarity, without requiring placement of heavy metal bars on top of the stack of encapsulated arrays prior to performing post-mold curing in order to avoid warpage.

Specifically, it has been determined that a molding material having the following properties or characteristics can be utilized for forming encapsulated arrays of electrical or electronic devices, e.g., semiconductor IC dies or chips, by molding, without incurring warpage resulting from post-mold curing at an elevated temperature, and without requiring placement of heavy metal bars on the tops of array stacks prior to performing the post-mold curing:

a reduced coefficient of thermal expansion (CTE) for providing good compatibility with the CTEs of the other components of the device package, e.g., IC chip, lead frame, and substrate; and increased flexural moduli at both high and low temperatures, for transmitting a reduced amount of bending stresses to the package components, particularly the foil or sheet-based substrate.

In addition to the above, it has been determined that a high, i.e., on the order of about 80 to about 90 wt. %, filler content of the molding material is advantageous in obtaining the improved properties of the molding materials of the present invention.

EXAMPLE

An epoxy resin-based encapsulant (Sumitomo No. 7351 LS, Sumitomo Bakelite Co. LTD, Utsonomiya, Japan) having the following primary molding material properties was utilized for forming device packages each comprising an about 0.011 mm thick IC chip, associated lead frame, and an about 0.127 mm thick Cu-based substrate:

| | | |
|---|---|---|
| Coefficient of Thermal Expansion (CTE): | $\alpha_1$ | $1.0 \times 10^{-5}/°$ C. |
| | $\alpha_2$ | $4.2 \times 10^{-5}/°$ C. |
| Flexural Modulus: | at 25° C. | 2,400 kgf/mm$^2$ |
| | at 260° C. | 80 kgf/mm$^2$ |
| Filler Content (Ash): | 84–89 wt. % | |

Molding was performed at a conventional temperature of about 175+/−5° C. for about 90 secs. and post-mold curing was similarly performed in a conventional manner, i.e., for about 5 hrs. at a temperature of about 175° C., with subsequent air cooling to ambient room temperature, utilizing magazines loaded with a plurality of vertically stacked molded arrays, but without placement of a heavy metal weight on top of the stack. The resultant encapsulated arrays were substantially free of warpage and loss of lead co-planarity.

In addition to the above-listed primary properties or characteristics, the epoxy resin-based molding material utilized in the Example exhibited the following secondary properties or characteristics:

| | |
|---|---|
| Resin grade: | semiconductor |
| Resin chemistry: | biphenyl |
| Spiral flow: | 140 cm at 175° C. |
| Gel time: | 35 sec. at 175° C. |
| Viscosity: | 90 poise at 175° C. |
| $T_g$: | 125° C. |
| Flexural strength: | 18 kgf/mm$^2$ at 25 ° C. |
| | 2.2 kgf/mm$^2$ at 260 ° C. |
| Thermal conductivity: | 20 cal./cm. ° C. sec. |
| Water absorption: | 0.18% (24 hrs. boiling water) |
| Specific gravity: | 1.98 |
| Mold shrinkage: | 0.12% (after post-mold curing) |
| Bromine content: | 0.2% |
| Antimony oxide content: | 3.45% |
| Filler shape ratio: | 100:0 (spherical:flake) |
| Average filler size: | 15–20 μm |

A number of advantages over the conventional molding/encapsulation processing for manufacturing, e.g., TSOP's, are thus provided by use of the inventive methodology wherein several properties of the molding/encapsulant material are selected to provide substantially no, or at least minimal, warpage following completion of post-mold curing treatment at an elevated temperature, including, inter alia, maintenance of lead co-planarity, avoidance of the use of heavy weight bars for minimizing warpage, and process simplification. Further, the inventive methodology is fully compatible with the throughput requirements of automated encapsulated semiconductor device manufacture and the inventive principles or concepts as expressed herein are not limited to use with semiconductor IC dies or chips, but rather are applicable to performing reliable molding/encapsulation of all manner of electrical components and devices.

In the previous description, numerous specific details have been set forth, such as specific materials, structures, processes, etc., in order to provide a better understanding of the present invention. However, the present invention can be practiced without resorting to the details specifically set forth. In other instances, well-known processing techniques, structures, and implements have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method of making at least one packaged electrical device or component, comprising the steps of:

(a) providing an elongated, strip-shaped substrate having a major surface adapted for mounting thereon an array comprising a plurality of spaced-apart electrical devices or components;

(b) providing and mounting said plurality of electrical devices or components in a spaced-apart array on said major surface of said substrate;

(c) encapsulating said array of electrical devices or components by molding utilizing a molding material selected to provide substantially no, or at least minimal, warping of said array or said substrate upon completion of a post-mold curing treatment performed without placement of a heavy weight on said array, wherein step (c) comprises encapsulating utilizing a molding material having a filler content on the order of from about 80 to about 90 wt. %. reduced coefficients of thermal expansion (CTE) $\alpha_1$ and $\alpha_2$ on the order of about $1 \times 10^{-5}/°$ C. and about $4 \times 10^{-5}/°$ C. respectively, and increased low and high temperature flexural moduli on the order of about 2,500 kgf/mm$^2$ and about 100 kgf/mm$^2$, respectively; and (d) performing said post-mold curing of the encapsulated array at an elevated temperature and for a time sufficient to complete curing of said molding material with substantially no, or at least minimal, warping of said array or said substrate leading to loss of electrical lead co-planarity.

2. The method as in claim 1, further comprising the step of:

(e) segmenting said array of encapsulated electrical devices or components to form said at least one packaged electrical device or component therefrom.

3. The method as in claim 1, wherein:

step (a) comprises providing a substrate comprised of copper (Cu) or a Cu-based alloy.

4. The method as in claim 1, wherein:

step (b) comprises providing a plurality of semiconductor devices.

5. The method as in claim 4, wherein:

step (b) comprises providing a plurality of semiconductor integrated circuit (IC) devices in the form of dies or chips, each having a plurality of co-planar electrical leads extending therefrom, and said at least one packaged device is a thin, small outline package (TSOP).

6. The method as in claim 1, wherein:

step (c) comprises utilizing an epoxy resin-based molding material.

7. The method as in claim 6, wherein:

step (c) comprises encapsulating said array in said epoxy resin-based molding material at a mold temperature of about 175° C.

8. The method as in claim 6, wherein:

step (d) comprises performing said post-mold curing of the encapsulated array at a temperature of about 175° C. for about 5 hours.

9. The method as in claim 8, wherein:

step (d) further comprises cooling the post-mold-cured encapsulated array in air to ambient room temperature.

10. A method of making at least one TSOP structure, comprising the steps of:

(a) providing an elongated, strip-shaped substrate having a major surface for mounting thereon a spaced-apart array comprising a plurality of low profile semiconductor integrated circuit (IC) devices in the form of dies or chips, each IC die or chip including a plurality of co-planar electrical leads extending therefrom for connection to circuitry on said substrate major surface;

(b) mounting said plurality of IC dies or chips in spaced-apart array on said substrate major surface;

(c) encapsulating said array of IC dies or chips by molding utilizing a molding material selected to provide substantially no, or at least minimal, warping of said array of IC dies or chips or said substrate upon completion of post-mold curing treatment without placement of a heavy weight on said array, thereby maintaining substantial co-planarity of said electrical leads, wherein step (c) comprises encapsulating utilizing an epoxy resin-based molding material having a filler content on the order of from about 80 to about 90 wt. %, reduced coefficients of thermal expansion (CTE) $\alpha_1$ and $\alpha_2$ on the order of about $1 \times 10^{-5}/°$ C. and about $4 \times 10^{31\ 5}/°$ C., respectively and increased low and high temperature flexural moduli on the order of about 2,500 kgf/mm$^2$ and about 100 kgf/mm$^2$, respectively; and (d) performing said post-mold curing of the encapsulated array at an elevated temperature and for a time sufficient to complete curing of said molding material with substantially no, or at least minimal, warping of said array or said substrate.

11. The method according to claim 10, wherein:

step (a) comprises providing a substrate comprised of copper (Cu) or a Cu-based alloy; and step (d) comprises performing post-mold curing of the encapsulated array at a temperature of about 175° C. for about 5 hours.

12. The method according to claim 11, wherein:

step (c) comprises encapsulating said array in said epoxy resin-based molding material at a mold temperature of about 175° C.; and step (d) further comprises cooling the post-mold-cured encapsulated array in air to ambient room temperature.

13. The method according to claim 11, wherein:

step (d) comprises performing said post-mold curing on a stacked plurality of encapsulated arrays.

14. The method according to claim 10, further comprising the step of:

(e) segmenting said encapsulated array to form at least one discrete TSOP structure.

15. An encapsulated semiconductor IC device of TSOP structure fabricated according to the method of claim 14.

16. The method according to claim 12, further comprising the step of:

(e) segmenting said encapsulated array to form at least one discrete TSOP structure.

17. An encapsulated semiconductor device of TSOP structure fabricated according to the method of claim 16.

* * * * *